(12) United States Patent
Eom

(10) Patent No.: US 11,480,241 B2
(45) Date of Patent: Oct. 25, 2022

(54) DISPLAY DEVICE

(71) Applicant: LG DISPLAY CO., LTD., Seoul (KR)

(72) Inventor: Hyeonyong Eom, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 426 days.

(21) Appl. No.: 16/719,082

(22) Filed: Dec. 18, 2019

(65) Prior Publication Data

US 2020/0212326 A1     Jul. 2, 2020

(30) Foreign Application Priority Data

Dec. 26, 2018 (KR) .................... 10-2018-0169836

(51) Int. Cl.
| | |
|---|---|
| *G09F 9/30* | (2006.01) |
| *F16H 55/22* | (2006.01) |
| *H01L 51/00* | (2006.01) |
| *H01L 27/32* | (2006.01) |
| *H01L 51/52* | (2006.01) |
| *G06F 1/16* | (2006.01) |
| *E06B 9/68* | (2006.01) |
| *G09F 13/04* | (2006.01) |
| *G09F 15/00* | (2006.01) |
| *H02K 7/10* | (2006.01) |
| *H02K 7/116* | (2006.01) |

(52) U.S. Cl.
CPC ............. *F16H 55/22* (2013.01); *E06B 9/68* (2013.01); *G06F 1/1652* (2013.01); *G09F 9/301* (2013.01); *G09F 13/0454* (2021.05); *G09F 15/0012* (2013.01); *H01L 27/3244* (2013.01); *H01L 51/0097* (2013.01); *H01L 51/5237* (2013.01); *F16C 2380/27* (2013.01); *H01L 2251/5338* (2013.01); *H02K 7/1004* (2013.01); *H02K 7/1166* (2013.01)

(58) Field of Classification Search
CPC .... G09F 9/301; G09F 13/0454; G06F 1/1616; G06F 1/1641; G06F 1/1652; H01L 51/0097; H01L 2251/5338; H05K 7/1166; F16C 2380/27
See application file for complete search history.

(56) References Cited

U.S. PATENT DOCUMENTS

| | | | |
|---|---|---|---|
| 2007/0171144 A1 | 7/2007 | Tanada | |
| 2014/0211399 A1* | 7/2014 | O'Brien | ................ G06F 1/1624 29/592.1 |
| 2015/0192952 A1* | 7/2015 | Jung | ........................ G06F 1/20 361/747 |

(Continued)

FOREIGN PATENT DOCUMENTS

| | | |
|---|---|---|
| CN | 103399616 A | 11/2013 |
| CN | 105578226 A | 5/2016 |

(Continued)

*Primary Examiner* — Joe H Cheng
(74) *Attorney, Agent, or Firm* — Birch, Stewart, Kolasch & Birch, LLP

(57) ABSTRACT

A display device is disclosed. The display device includes a base display panel, a back cover supporting a rear portion of the base display panel, sliding frames sliding with respect to the back cover, a driving unit configured to drive the sliding frames to slide, and a rollable display panel being extendable in response to the sliding of the sliding frames. The rollable display panel can be extended as needed by a user when widescreen images are displayed.

10 Claims, 14 Drawing Sheets

(56) References Cited

U.S. PATENT DOCUMENTS

| | | | |
|---|---|---|---|
| 2016/0170450 A1 | 6/2016 | Kim et al. | |
| 2016/0187929 A1* | 6/2016 | Kim | G06F 1/1643 |
| | | | 345/184 |
| 2016/0353588 A1* | 12/2016 | Kim | G09F 9/301 |
| 2016/0363960 A1* | 12/2016 | Park | G09F 9/301 |
| 2016/0374228 A1* | 12/2016 | Park | G09F 15/0062 |
| 2017/0139442 A1* | 5/2017 | Yoshizumi | H04M 1/0268 |
| 2017/0156219 A1 | 6/2017 | Heo et al. | |
| 2017/0318693 A1* | 11/2017 | Kim | H02K 11/21 |
| 2017/0344073 A1* | 11/2017 | Kang | G06F 1/1652 |
| 2017/0367198 A1* | 12/2017 | Park | H04M 1/0268 |
| 2018/0077808 A1* | 3/2018 | Seo | G06F 3/044 |
| 2018/0114471 A1* | 4/2018 | Park | G09G 3/3233 |
| 2020/0135064 A1* | 4/2020 | Lee | G06F 1/1652 |

FOREIGN PATENT DOCUMENTS

| | | |
|---|---|---|
| CN | 107993574 A | 5/2016 |
| CN | 105741683 A | 7/2016 |
| CN | 106251779 A | 12/2016 |
| CN | 106534649 A | 3/2017 |
| CN | 106875846 A | 6/2017 |
| CN | 107369382 A | 11/2017 |
| CN | 107452282 A | 12/2017 |
| CN | 106257569 A | 12/2018 |
| EP | 2 522 510 A1 | 11/2012 |
| KR | 10-2016-0140036 A | 12/2016 |
| KR | 10-2017-0062343 A | 6/2017 |

\* cited by examiner

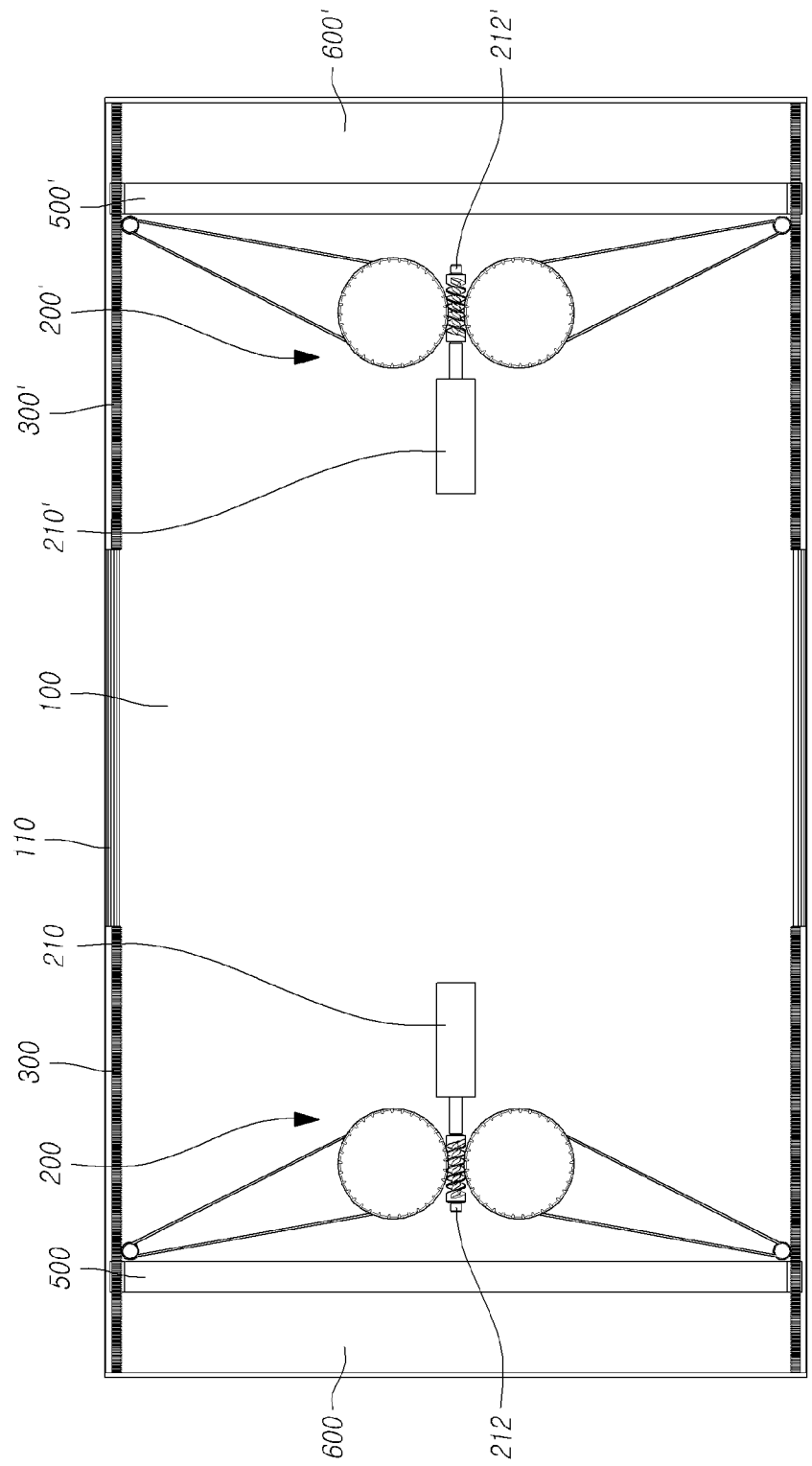

DISPLAY DEVICE

CROSS REFERENCE TO RELATED APPLICATION

This application claims priority to Korean Patent Application No. 10-2018-0169836, filed on Dec. 26, 2018, which is hereby incorporated by reference for all purposes as if fully set forth herein.

BACKGROUND

Field

Embodiments of the present disclosure relate to a display device and, more particularly, to an extendable display device having a structure by which a rollable display device can be extended.

Description of Related Art

With the development of a variety of mobile electronic devices, such as mobile communications devices and notebook computers, a demand for flat panel display devices applicable to such mobile electronic devices is also increasing.

Research into flat display devices, such as liquid crystal display (LCD) devices, plasma display panel (PDP) devices, field emission display (FED) devices, light-emitting diode (LED) display devices, and organic light-emitting diode (OLED) display devices, has been actively undertaken.

Among such display devices, LCD devices respectively include an array substrate including thin-film transistors (TFTs); a top substrate including at least one of a color filter, a black matrix, or the color filter and the black matrix; and a liquid crystal layer provided between the array substrate and the top substrate. In such an LCD device, the alignment of the liquid crystal layer is adjusted in response to an electric field applied between both electrodes in a pixel area to adjust the transmission of light, so that an image is displayed.

In addition, the OLED display devices that have recently come to prominence have advantages, such as rapid response rates, high emission efficiency, high luminous intensity, and wide viewing angles, since a self-light-emitting organic light-emitting diode (OLED) is used therein.

The OLED display devices respectively using self-light-emitting devices do not need a backlight used in an LCD device using a non-self-emitting device, and thus, can have a thin and light profile. In addition, OLED display devices have advantageous features, such as wide viewing angles, a high contrast ratio, and low power consumption, compared to LCD display devices. In addition, OLED display devices cannot only be driven using a lower direct current (DC), but also have rapid response rates, high durability against external impacts due to solid-state internal components thereof, and a wide operating temperature range. In particular, OLED display devices have the merit of relatively low fabrication costs.

In particular, OLED display panels used in the OLED display devices can be fabricated from a flexible material, such as plastic, thin glass, or metal, such that resultant flexible panels can display images, even when bent. Flexible display devices using such flexible panels are attracting attention as the next-generation display devices.

Flexible display devices have advantages, such as a high degree of design freedom, portability, and durability. The flexible display devices can be provided in various forms of display devices, such as a bendable display, a foldable display, and a rollable display.

The flexible display devices are applicable not only to mobile devices, such as a smartphone and a tablet personal computer (PC), but also to a television (TV), an automobile display, a wearable device, and the like, and fields of application thereof are increasing.

In particular, a rollable display device can be conveniently rolled and unrolled to be used as needed, since it is possible to wind the rollable display device by applying a certain amount of force thereto.

In addition, the aspect ratio of current display devices, such as a TV, is currently fixed to 4:3 or 16:9. To display horizontally-wide video images, such as widescreen images, a portion of the top area of the display device should be processed to be black. This, however, can unnecessarily reduce the viewing area of the display device, which is problematic.

Therefore, there is a demand for the development of a display device that can be extended in a predetermined direction by a user's choice, as needed to provide the effect of a widescreen of a movie theatre.

BRIEF SUMMARY

In this regard, embodiments of the present disclosure are intended to propose an extendable display device using a rollable display panel.

Various aspects of the present disclosure provide an extendable display device having a structure able to extend a rollable display panel, thereby expanding a viewing area in a predetermined direction.

Also provided is a display device including a base display panel and an extension structure comprised of a motor, gears, and sliding frames, the extension structure being able to extend a rollable display panel from the base display panel.

Also provided is a display device including a base display panel, sliding frames slidable with respect to a back cover, and a rollable display panel extendable outside of a rolling module in response to the sliding of the sliding frames, so that the rollable display panel can be extended as desired by a user when widescreen images are displayed.

According to embodiments, a display device can include a base display panel; a back cover supporting a rear portion of the base display panel; sliding frames sliding with respect to the back cover; a driving unit driving the sliding frames to slide; and a rollable display panel being extendable in response to the sliding of the sliding frames.

More specifically, the display device can further include a rolling module fixed to the back cover and winding the rollable display panel therein. The back cover can include a bottom rails provided on a top portion and a bottom portion thereof, respectively, to extend in a direction, the sliding frames can respectively include a top rail, a side gear, and a rear gear, the top rail being engaged with a corresponding bottom rail of the bottom rails, and the driving unit can be gear-engaged with the side gears of the sliding frames to slide the sliding frames with respect to the bottom rail of the back cover. The rollable display panel can be extended from the rolling module or retracted into the rolling module in response to the sliding of the sliding frames.

The driving unit can include a motor fixed to the back cover; a worm shaft connected to a motor shaft of the motor; a worm wheel gear having first gear teeth engaged with the worm shaft; a following gear rotating in response to rotation of the worm wheel gear, the following gear having second gear teeth engaged with the side gear of a corresponding sliding frame of the sliding frames; and a belt transferring power between the worm wheel gear and the following gear.

According to another embodiment, the driving unit includes a motor fixed to the back cover; a worm shaft connected to a motor shaft of the motor; a worm wheel gear having first gear teeth engaged with the worm shaft; a driving pulley disposed on the worm wheel gear; a following gear rotating in response to rotation of the worm wheel gear, the following gear having second gear teeth engaged with the side gear of a corresponding sliding frame of the sliding frames; a following pulley disposed on the following gear; and a belt connected between the driving pulley and the following pulley.

In addition, the rolling module can include a body; a panel holder supporting a side portion of the rollable display panel; a shaft rotating together with the panel holder; and a rolling gear fixedly coupled to the shaft and the panel holder, and engaged with the rear gear of a corresponding sliding frame of the sliding frames to rotate in response to the sliding of the sliding frames.

In addition, the rolling module can further include side caps coupled to both ends of the body, respectively, a portion of the rolling gear being exposed from a corresponding side cap of the side caps to be engaged with the rear gear of a corresponding sliding frame of the sliding frames.

In addition, the driving units, the sliding frames, the rolling modules, and the rollable display panels can be symmetrically disposed on both portions of the display device.

The display device can further include a side frame coupled to a side portion of the rollable display panel to move along with the sliding of the sliding frames.

The rollable display panel can include an organic light-emitting display panel including: a substrate; a plurality of thin-film transistors disposed on the substrate; a light-emitting layer including an organic light-emitting element layer between both electrode layers disposed on the thin-film transistors; and an encapsulation layer disposed on the light-emitting layer.

According to exemplary embodiments, the extendable display device has a structure able to extend the rollable display panel with respect to the base panel, thereby expanding a viewing area in a predetermined direction.

More specifically, the extendable display device includes the base display panel, as well as an extension structure comprised of the motor, the gears, and the sliding frames. The extension structure can extend the rollable display panel with respect to the base display panel.

In addition, the display device includes the base display panel, the sliding frames slidable with respect to the back cover, and the rollable display panel extendable outside of the rolling module in response to the sliding of the sliding frames, so that the user can extend the rollable display panel as needed when widescreen images are displayed.

DESCRIPTION OF DRAWINGS

The above and other objects, features, and advantages of the present disclosure will be more clearly understood from the following detailed description, taken in conjunction with the accompanying drawings, in which:

FIGS. 10A and 10B illustrate two applications of the driving unit in the display device according to embodiments of the present disclosure;

DETAILED DESCRIPTION OF THE EMBODIMENTS

Figure 1:
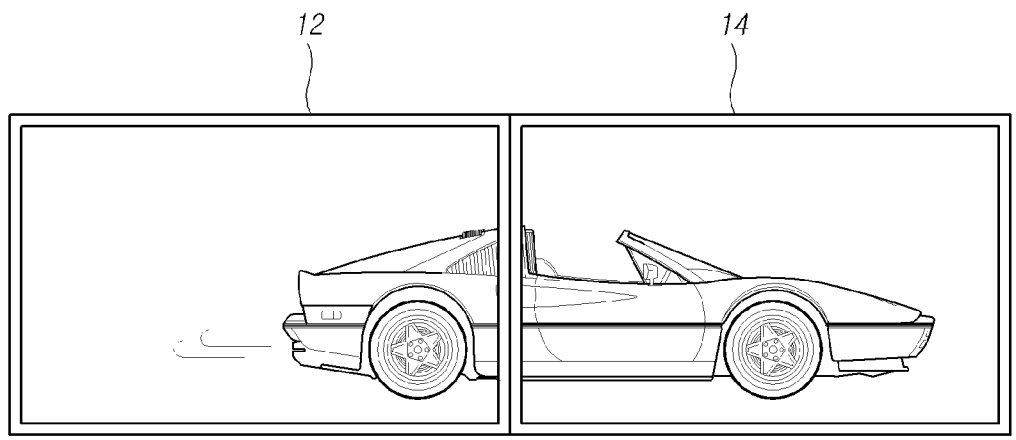
FIG. 1 illustrates an example of extension of a general display device.

Hereinafter, some embodiments of the present disclosure will be described in detail with reference to the accompanying illustrative drawings. In designating elements of the drawings by reference numerals, the same elements will be designated by the same reference numerals although they are shown in different drawings. Further, in the following description of the present disclosure, a detailed description of known functions and configurations incorporated herein will be omitted in the situation in which the subject matter of the present disclosure can be rendered rather unclear thereby.

In addition, terms, such as first, second, A, B, (a), (b) or the like can be used herein when describing components of the present disclosure. Each of these terminologies is not used to define an essence, order or sequence of a corresponding component but used merely to distinguish the corresponding component from other component(s). In the case that it is described that a certain structural element "is connected to", "is coupled to", or "is bonded with" another structural element, it should be interpreted that another structural element can "be connected to", "be coupled to", or "be in contact with" the structural elements as well as that the certain structural element is directly connected to or is in direct contact with another structural element.

FIG. 1 illustrates an example of extension of a general display device.

As illustrated in FIG. 1, a general individual display device, such as a television (TV), has a fixed aspect ratio, such as 4:3 or 16:9. The size of the display device is fixed by a fixed bezel surrounding the display device.

Thus, in a case in which a widescreen movie or widescreen images prepared for a projection screen having an aspect ratio of about 2.35:1 should be displayed, a method of connecting two or more individual display devices 12 and 14 to extend the screen can be used.

In such an extendable display device, a viewing surface is disconnected in a portion corresponding to the contacting bezels of the two individual display devices, and thus, it becomes difficult to express a seamless image, which is problematic for the general display device of FIG. 1.

In addition, in the case of home or general-use display devices, it is practically impossible to connect two or more display devices. In addition, when such a display device is used alone, a portion of the top area of the screen thereof should be processed to be black, thereby unnecessarily reducing the viewing area of the display device, which is problematic.

In addition, organic light-emitting diode (OLED) display devices currently under development can be respectively fabricated such that a display panel thereof has a certain level of flexibility, since a backlight unit is unnecessary, due to the use of self-light-emitting devices, and a substrate of the display panel is designed to be extremely thin.

Such flexible display technology leads to the development of a rollable display device, the flexibility of which exceeds the ability to bend at a certain level, so that the rollable display device can be rolled at a predetermined or higher curvature in response to a predetermined amount of force being applied thereto.

Accordingly, the embodiments of the present disclosure are intended to provide an extendable display device including a rollable display panel and to provide an extendable display device which address the limitations and disadvantages associated with the related art.

Specifically, embodiments of the present disclosure are to provide a display device including a base display panel, sliding frames slidable with respect to a back cover, and a rollable display panel extendable outside of a rolling module in response to the sliding of the sliding frames, so that the rollable display panel can be extended as needed by a user when widescreen images are displayed.

Hereinafter, specific configurations of an extendable display device according to embodiments will be described with reference to FIGS. 2 to 11.

Figure 2:
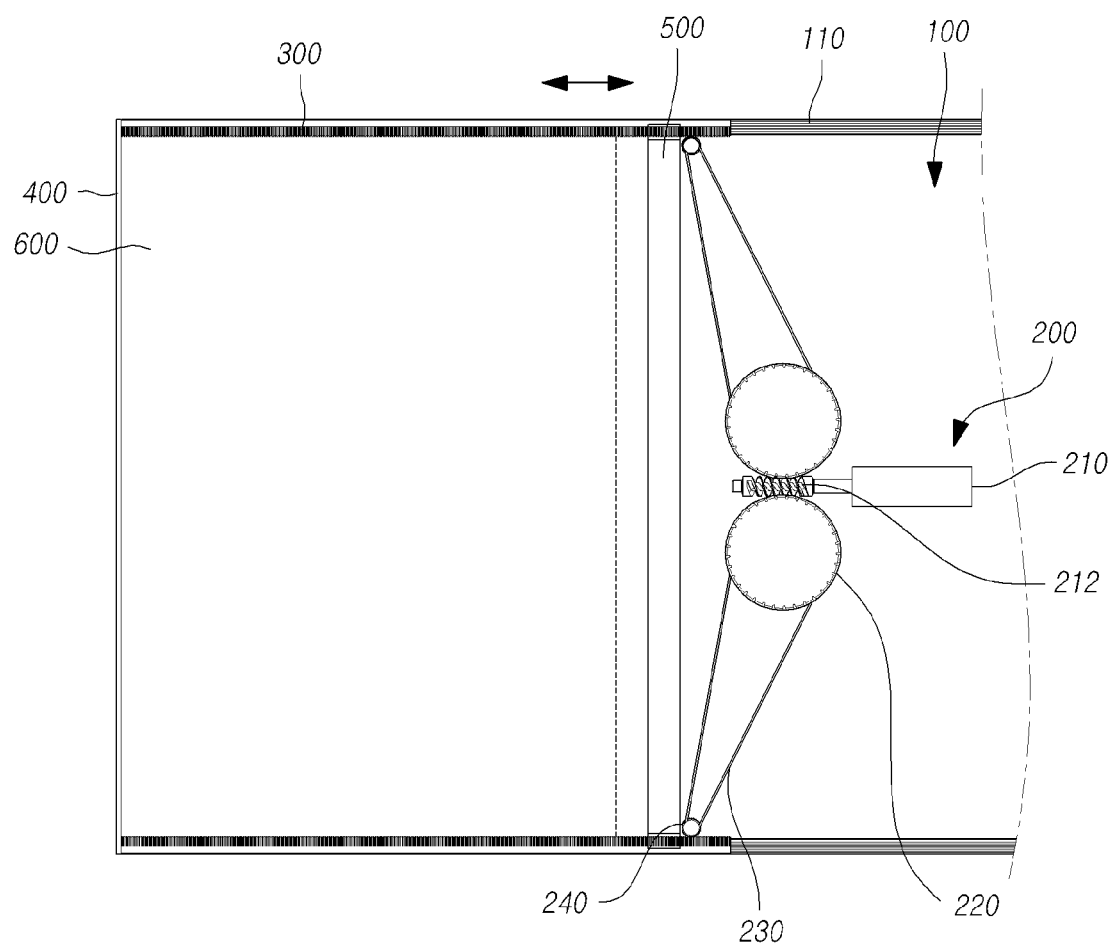
FIG. 2 is a rear view illustrating an overall structure of an extendable display device according to embodiments of the present disclosure.
Figure 3:
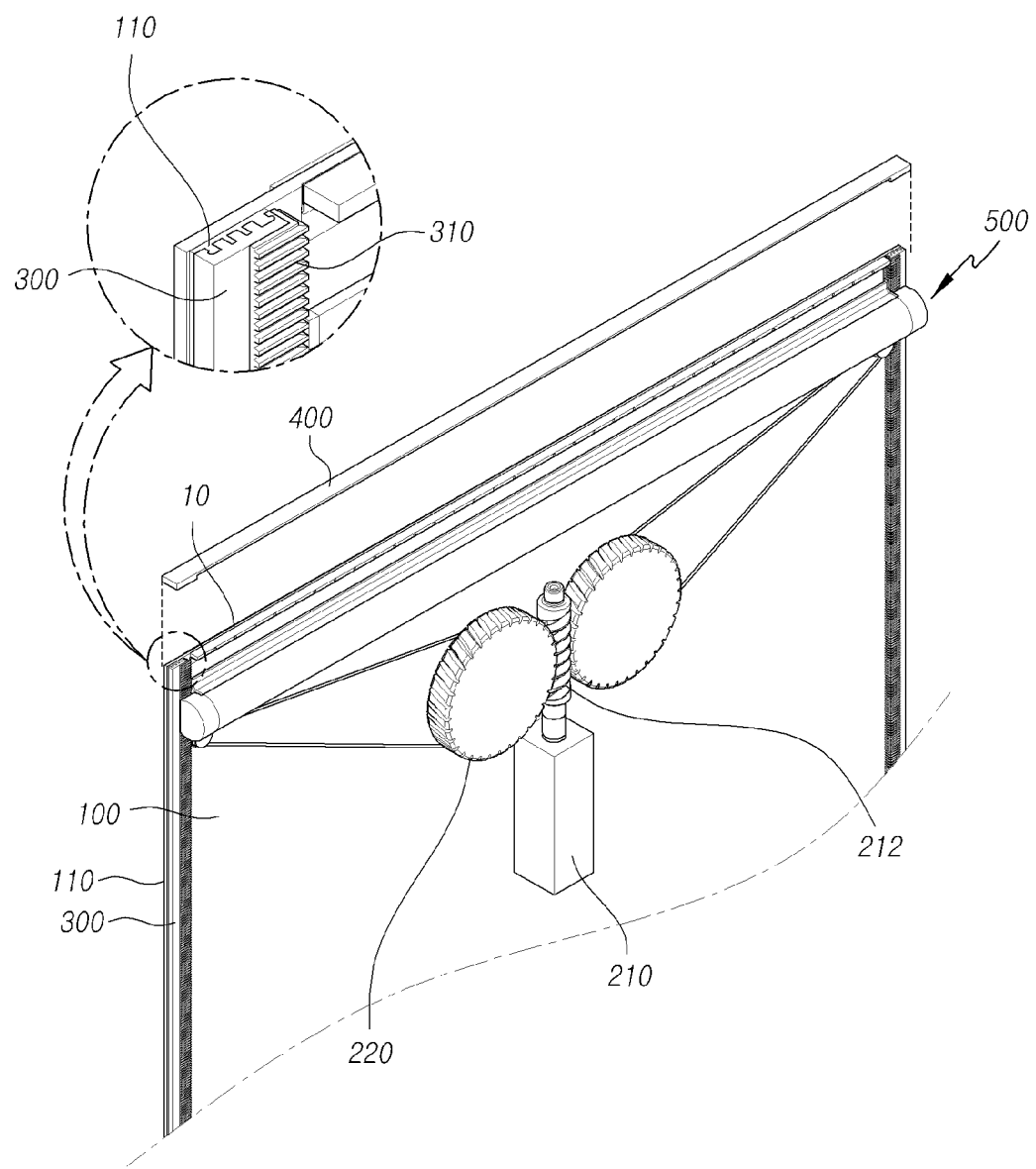
FIG. 3 is a first perspective of the extendable display device according to embodiments of the present disclosure, in which the rolling module is attached to the back cover.
Figure 4:
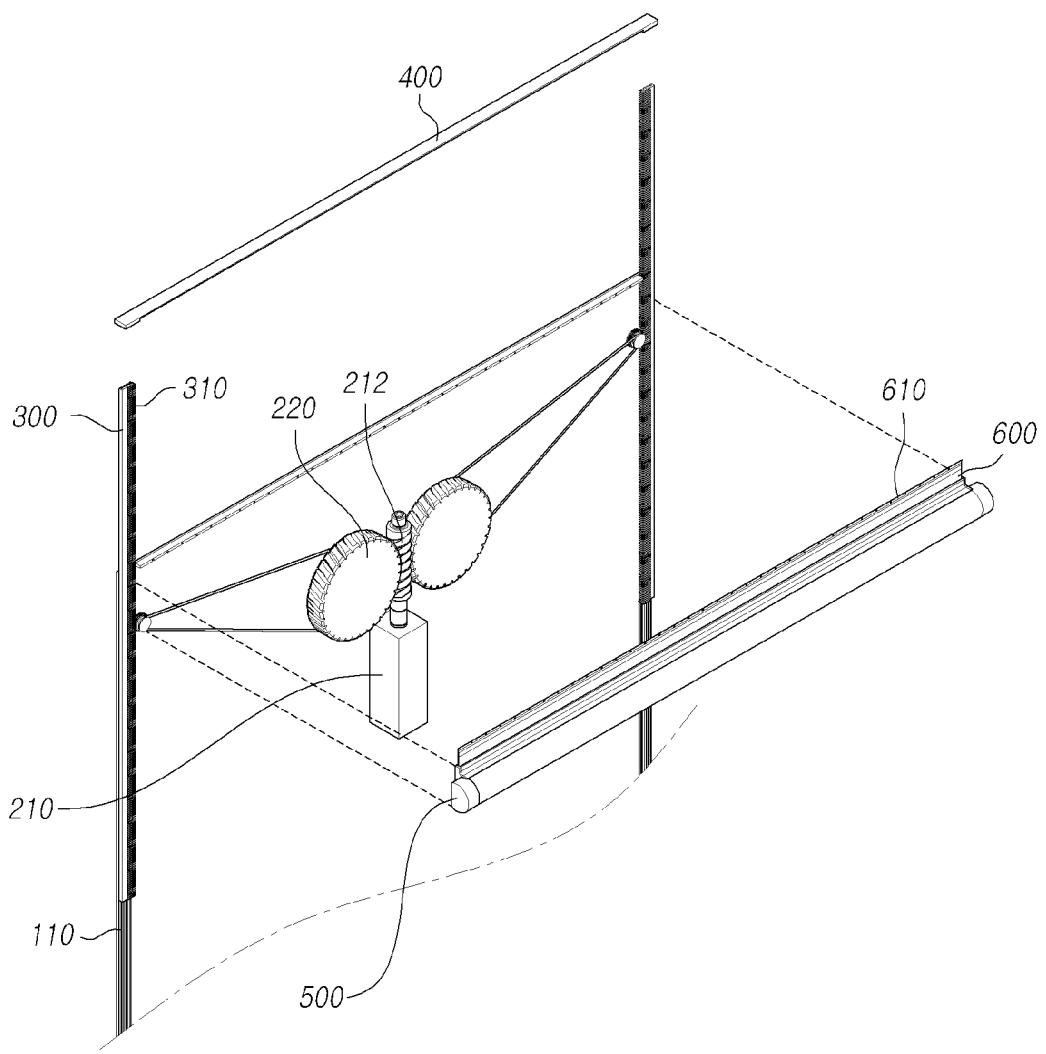
FIG. 4 is a second perspective view of the extendable display device according to embodiments of the present disclosure, in which the rolling module is detached from the back cover.

FIG. 2 is a rear view illustrating an overall structure of an extendable display device according to embodiments, FIG. 3 is a first perspective of the extendable display device according to embodiments, in which the rolling module is attached to the back cover, and FIG. 4 is a second perspective view of the extendable display device according to embodiments, in which the rolling module is detached from the back cover.

Figure 5:
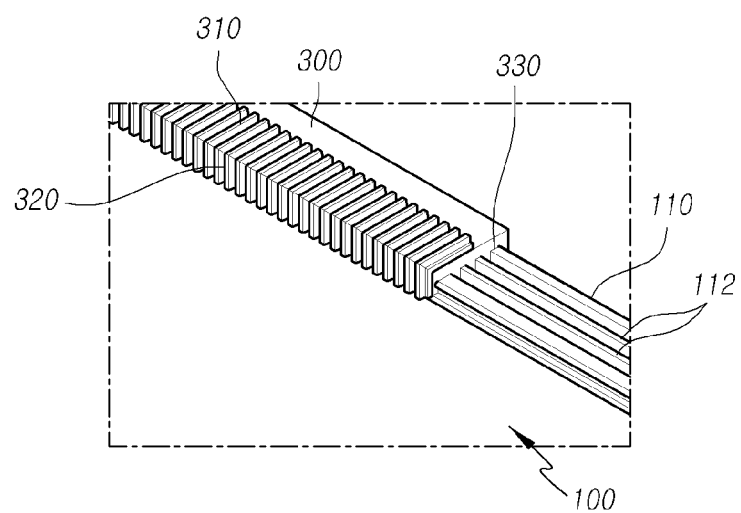
FIG. 5 illustrates a rail-connecting structure of the back cover and the sliding frames in the extendable display device according to embodiments of the present disclosure.

FIG. 5 illustrates a rail-connecting structure of the back cover and the sliding frames in the extendable display device according to embodiments.

As illustrated in FIGS. 2 to 5, the extendable display device according to embodiments generally includes a base display panel 10, a back cover 100, sliding frames 300 slidable with respect to the back cover 100, a driving unit 200, i.e., a mechanical structure for driving the sliding frames 300 to slide, and a rollable display panel 600 extendable from a rolling module 500 in response to the sliding of the sliding frames 300.

In addition, the extendable display device can further include the rolling module 500 fixed to one portion of the back cover 100 to wind the rollable display panel 600 therein. The rolling module 500 works in concert with the sliding frames 300 to outwardly expose the rollable display panel 600 from the rolled position or to wind and roll up the rollable display panel 600, in response to the sliding of the sliding frames 300.

The base display panel 10 is a display panel providing a base active area, i.e., an image display area before extension, of the display device according to embodiments. The base display panel 10 according to embodiments can be an OLED display panel that does not require a backlight unit, even though the display panel can be a liquid crystal display (LCD) panel, an OLED display panel, or the like.

The back cover 100 is a rear support structure supporting the entire rear surface of the base display panel 10. Bottom rails 110 are provided on top and bottom surfaces of the back cover 100 to extend in a first direction (e.g., a horizontal direction).

For instance, the back cover 100 is a plate structure having an overall flat shape, in which the bottom rails 110 extend along predetermined lengths of the top and bottom peripheral portions of the back cover 100. Each of the bottom rails 110 is provided with protruding bars.

The bottom rails 110 are coupled to top rails 330 of the sliding frames 300, respectively, to serve as guides when the sliding frames 300 slide with respect to the back cover 100 in the horizontal direction.

Specifically, as illustrated in FIG. 5, each of the bottom rails 110 of the back cover 100 includes a plurality of protruding bars 112, while each of the top rails 330 of the sliding frames 300 has a plurality of grooves into which the protruding bars 112 are fitted.

The bottom rails 110 can be provided integrally with the back cover 100, or can be fabricated separately from the back cover 100 and horizontally coupled and fixed to the top and bottom peripheral portions of the back cover 100.

The back cover 100 not only can serve to guide the movement of the sliding frames 300 while supporting the rear portion of the base display panel 10, but also can be used as a support to fix the driving unit 200 and the rolling module 500 according to embodiments, as will be described later.

The back cover 100 according to embodiments can be made of a metal or a metal-containing material. For example, the back cover 100 can be made of a pre-coated metal (PCM) material, e.g., a color steel sheet material, produced by covering a steel material with a polyester resin or attaching a lamination film to the steel material. The steel material can be one selected from among, but not limited to, electrolytic galvanized steel (EGI), galvanized steel, galvalume steel, and aluminized steel.

In particular, the back cover 100 can be made of a reinforced plastic material to be fabricated integrally with the bottom rails 110.

The term "back cover" used herein is not limiting, but a variety of other terms, such as a bottom plate (or plate bottom), a bottom cover (or cover bottom), a base frame, a metal frame, a metal chassis, a chassis base, and an m-chassis, can also be used. It should be understood that the back cover conceptually include any structure, such as a frame or a plate, disposed on a rear base portion of the display device as a structure to support the base display panel.

Each of the sliding frames 300 has the top rail 330 provided on the front surface thereof. The top rail 330 is a bar-shaped structure, a portion of which is coupled to the corresponding bottom rail 110 of the back cover 100, such that the top rail 330 can slide in the first direction (e.g., the horizontal direction). The top rails 330 can be two rails disposed on the top portion and the bottom portion of the display device, respectively.

Herein, for the sake of brevity, a surface of the display device on which an image is displayed will be referred to as a "front surface," a surface opposite the front surface will be referred to as a back surface or a rear surface, and surfaces perpendicular to the front surface and the rear surface will be referred to as side surfaces or side portions.

A rear gear 310 is provided on the rear surface of the sliding frame 300, facing the top rail 330, and a side gear 320 is provided on a surface the sliding frame 300, facing inward of the display device.

The side gear 320 of the sliding frame 300 includes a plurality of gear teeth disposed with predetermined pitches. The side gear 320 is gear-engaged with a following gear 240 of the driving unit 200. The driving unit 200 is a mechanical structure gear-engaged with the side gears 320 of the sliding frames 300 to slide the sliding frames 300 with respect to the bottom rails 110 of the back cover 100 in the horizontal direction.

The driving unit 200 can have a torque transfer structure comprised of a worm, worm wheels, and belts.

For example, the driving unit 200 can include a motor 210 fixed to a rear portion of the back cover 100, a worm shaft 212 connected to a motor shaft of the motor 210, worm wheel gears 220 respectively having first gear teeth provided on the outer circumference thereof to engage with the worm shaft, following gears 240 rotating in response to the rotation of the worm wheel gears and gear-engaged with the side gears 320 of the sliding frames 300, and belts 230 connecting the worm wheel gears 220 and the following gears 240 to serve as a power transmission therebetween.

Here, the motor 210 can be a step motor including a rotation angle sensor to accurately adjust the amount of extension of the rollable display panel 600.

The motor shaft of the motor 210 is connected to the worm shaft 212. The worm shaft 212 has worm gear teeth on the outer circumference thereof to engage with the first gear teeth of the worm wheel gears 220.

The worm shaft 212 serves to convert the rotation of the motor shaft into the rotation of the worm wheel gears 220 by changing the axial direction of the rotation of the motor shaft by 90°. A suitable reduction ratio is determined on the basis of the pitch of the worm gear teeth of the worm shaft 212, the pitch of the first gear teeth of the worm wheel gears 220, and the radius of the worm wheel gears 220.

In addition, the following gears 240 are rotatably fixed to portions of the back cover 100 using shafts. Second gear teeth of the following gears 240 are disposed to engage with the above-described side gears 320 of the sliding frames 300.

The belts 230 are disposed between the worm wheel gears 220 and the following gears 240 to transfer the torque of the worm wheel gears 220 to the following gears 240. The belts 230 can be implemented as a typical timing belt.

The worm wheel gears 220 and the following gears 240 according to embodiments can be rotatably supported at specific positions of the rear surface of the back cover 100 using a shaft, such as a PEM® nut.

Referring to the operation of the driving unit 200, when the worm shaft 212 and the worm wheel gears 220 coupled to gear-engaged with worm shaft 212 rotate in response to the rotation of the motor 210, the following gears 240 connected to the worm wheel gears 220 via the belts 230 rotate, so that the second gear teeth of the following gears 240 push the side gears 320 of the sliding frames 300 in a straight direction. Consequently, the sliding frames 300 are moved with respect to the bottom rails 110 of the back cover 100 in the horizontal direction.

In addition, the rolling module 500 includes a rolling gear 540 serving to wind the rollable display panel 600 within the rolling module 500. The rolling gear 540 is connected to a rolling shaft of the rollable display panel 600 to rotate together with the rollable display panel 600.

The rolling gear 540 is gear-engaged with the rear gear 310 of the sliding frame 300. When the sliding frame 300 slides, the rear gear 310 rotate the rolling gear 540. In response to the rotation of the rolling gear 540, the rollable display panel 600 coupled thereto can be extended outwardly or retracted inwardly.

A specific configuration of the rolling module 500 and the extension/retraction structure of the rollable display panel 600 will be described in more detail with reference to FIGS. 6 to 8.

The rollable display panel 600 is wound within the rolling module 500. The rollable display panel 600 can be extended from or retracted into the rolling module 500, in association with the linear movement of the sliding frames 300.

The shape and specific configuration of the rollable display panel 600 will be described in more detail below with reference to FIG. 12.

In addition, the display device according to embodiments further includes a side frame 400 coupled to a side portion of the rollable display panel 600 to horizontally move along with the movement of the sliding frames 300.

In addition, a connecting member 610 can be further provided. The connecting member 610 is coupled to the side portion of the rollable display panel 600 to couple the side frame 400 to the rollable display panel 600. The connecting member 610 can be fixed to the side frame 400.

The side frame 400 is a bar-shaped member constituting a side support of the extendable display device according to embodiments. The side frame 400 can be connected to one ends of the top and bottom sliding frames 300.

Although the sliding frames 300 and the side frame 400 have been described hereinabove as being separate, the sliding frames 300 and the side frame 400 can be provided as a single member.

The sliding frames 300 and the side frame 400 can be connected to each other, thereby forming a C-shaped three-section frame. Here, the top and bottom sections can serve as the sliding frames 300, while the side section can serve as the side frame 400.

Since the side frame 400 is coupled to the sliding frames 300 and one side portion of the rollable display panel 600 as described above, when the sliding frames 300 slide with respect to the back cover 100 in the first direction (or horizontal direction), the side frame 400 can support extension and retraction of the rollable display panel 600 by pushing or pulling the side portion of the rollable display panel 600.

The side portion of the rollable display panel 600 can be fixedly press-fitted into the groove provided in the inner surface of the side frame 400.

Figure 6:
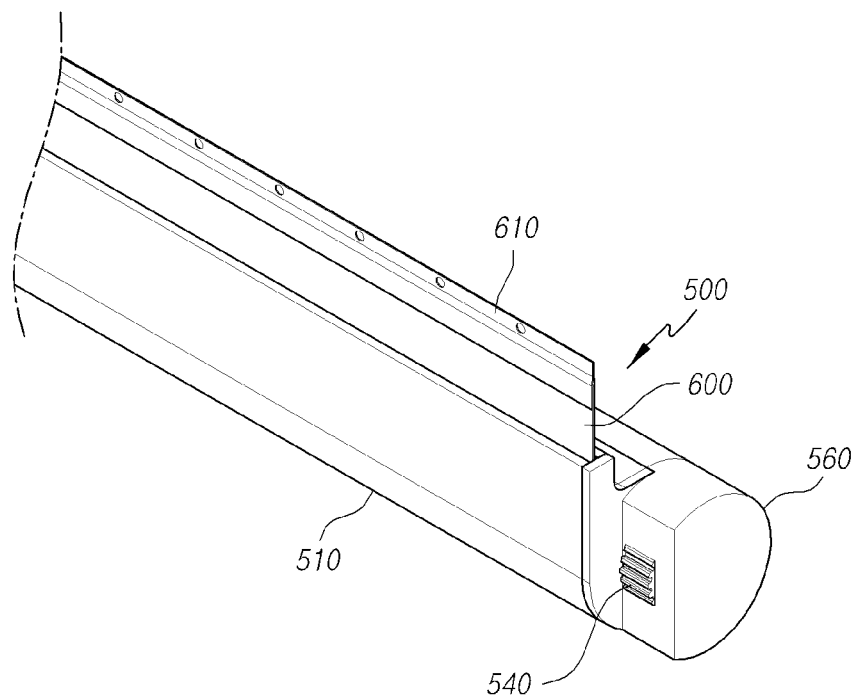
FIG. 6 is a perspective view illustrating the rolling module and the rollable display panel, coupled to each other, in the display device according to embodiments of the present disclosure.

Alternatively, as illustrated in FIGS. 4 and 6, the connecting member 610 having a plurality of recesses is further provided on the side portion of the rollable display panel 600, and protrusions of the side frame 400 are fitted into the recesses of the connecting member 610, such that the rollable display panel 600 can be strongly coupled to the side frame 400.

Figure 7:
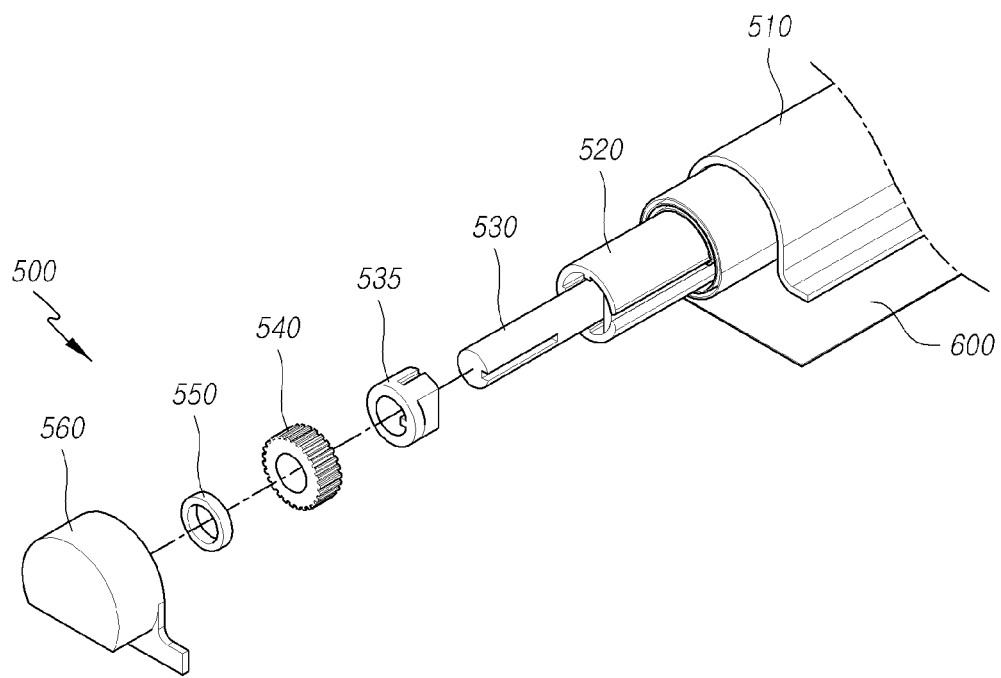
FIG. 7 is an exploded view illustrating specific components of the rolling module of the display device according to embodiments of the present disclosure.
Figure 7:
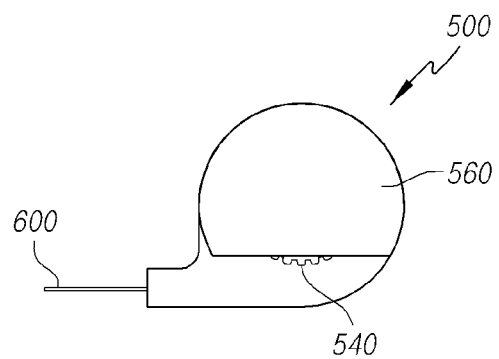

FIG. 6 is a perspective view illustrating the rolling module 500 and the rollable display panel 600, coupled to each other, in the display device according to embodiments, and FIG. 7 is an exploded view illustrating specific components of the rolling module 500 of the display device according to embodiments.

Referring to FIGS. 6 and 7, the rolling module 500 of the display device according to embodiments is a structure fixed to a portion of the back cover 100, with the rollable display panel 600 wound therein.

Specifically, the rolling module 500 can include a body 510, a panel holder 520 supporting the other side portion of the rollable display panel 600, a shaft 530 rotating together with the panel holder 520, the rolling gear 540 fixedly coupled to the shaft 530 and the panel holder 520, and the like.

The rolling module 500 can further include side caps 560 coupled to both ends of the body 510 to cover the rolling gear 540 and the like.

The rolling gear 540 has the shape of a wheel gear, with threads being provided on the outer circumference thereof to engage with the rear gear 310 of the sliding frame 300. Due to this configuration, the rolling gear 540 rotates in response to the sliding of the sliding frames 300.

The body of the rolling module 500 is a C-shaped hollow pipe, with an open portion being provided in a portion of the rolling module 500. The body of the rolling module 500 accommodates the panel holder 520, the shaft 530, the rollable display panel 600, and the like therein.

The panel holder 520 is the C-shaped hollow pipe, with the open portion extending in the longitudinal direction thereof. The other side portion of the rollable display panel 600 is fixed to the open portion.

That is, one of both vertical peripheral portions of the rollable display panel 600 is fixed to the open portion of the panel holder 520, while the other vertical peripheral portion of the rollable display panel 600 is exposed from the rolling module 500 and is fixed to the side frame 400.

In addition, the shaft 530 is accommodated within the panel holder 520, and a bush 535 is provided on one end of the shaft 530 to connect the shaft 530 to the panel holder 520 while covering the one end of the shaft 530.

The shaft 530 forms the axis of rotation of the rolling module 500, and rotates along with the rotation of the rolling gear 540 connected thereto. In response to the rotation of the shaft 530, the panel holder 520 fixed thereto also rotates, so that winding and unwinding of the rollable display panel 600 are controlled.

The rolling gear 540 is fixedly press-fitted to one portion of the shaft 530. One end of the shaft 530 is rotatably supported to the side cap 560 via a bearing 550.

The side caps 560 are coupled to both ends of the body 510 to form the outer shape of the rolling module 500, and accommodate the bearings 550 and the rolling gears 540 therein.

In particular, as illustrated in the bottom of FIG. 7, an open area is formed in a portion of the side cap 560, such that a portion of the rolling gear 504 is exposed through the open area.

The rolling gear 504, exposed through the open area as described above, is gear-engaged with the rear gear 310 of the sliding frame 300 to rotate in response to the sliding of the sliding frame 300.

In addition, the rolling module 500 can further include a fixing member, such as a fixing cap, by which the rolling module 500 is fixed to the back cover 100.

As described above, the rolling module 500 is an assembly fixed to the rear surface of the back cover 100 while accommodating the rollable display panel 600 therein. The rolling module 500 further includes the rolling gears 540 connected to the rear gears 310 of the sliding frames 300. With this structure, the rolling module 500 allows the rollable display panel 600 to be unwound and wound in response to the sliding of the sliding frames 300.

The rolling module 500 can have a different structure or can be referred to by a different term as long as the same or equivalent function can be performed.

Figure 8:
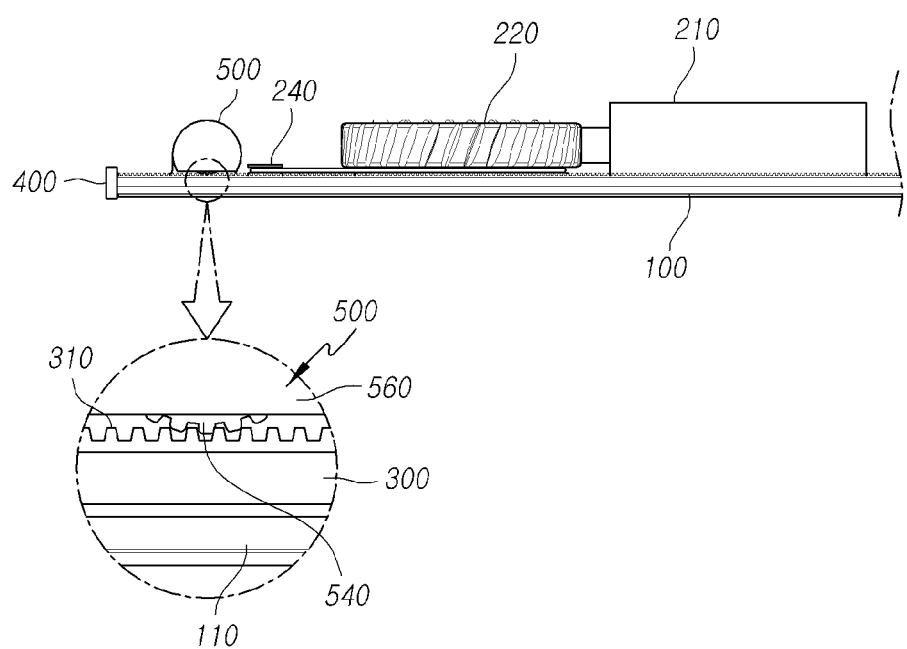
FIG. 8 illustrates the principle of the sliding of the sliding frames, as well as the resultant rotation of the rolling module, in the display device according to embodiments of the present disclosure.

FIG. 8 illustrates the principle of the sliding of the sliding frames 300, as well as the resultant rotation of the rolling module 500, in the display device according to embodiments.

As illustrated in FIG. 8, the rolling module 500 is fixedly disposed on the back cover 100 to extend in the vertical direction, and a portion of the rolling gear 540 of the rolling module 500 is exposed from the side cap 560 of the rolling module 500.

In this position, when the following gears 240 of the driving unit 200 rotate, the side gears 320 of the sliding frames 300, coupled to the following gears 240, cause the sliding frames 300 to linearly move with respect to the back cover 100.

In response to the linear movement of the sliding frames 300, the rolling gears 540 of the rolling module 500, engaged with the rear gears 310 of the sliding frame 300, rotate. Then, the shaft 530 and the panel holder 520 within the rolling module 500 rotate along with the rear gears 310.

Consequently, along with the rotation of the panel holder 520, the rollable display panel 600 is unwound from or wound on the panel holder 520.

Here, since one peripheral portion of the rollable display panel 600 is fixed to the sliding frame 300 or the side frame 400 fixed to the sliding frame 300, the rollable display panel 600 is unwound or wound in response to the rotation of the shaft 530 and the panel holder 520, thereby providing an extended portion of the display panel.

Figure 9A:
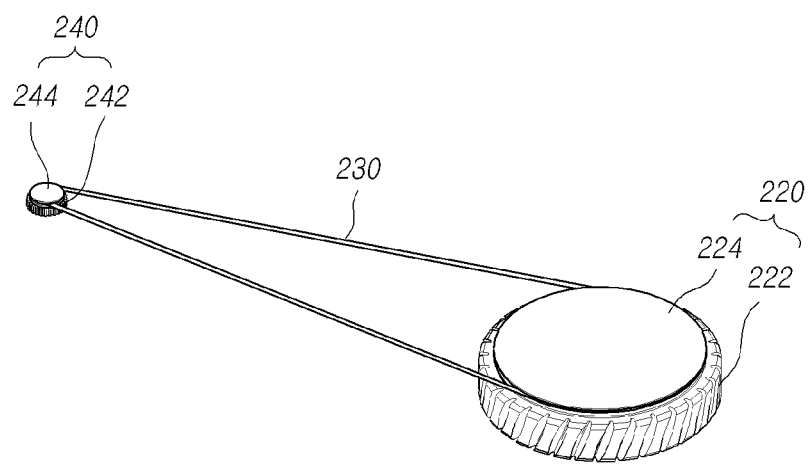
FIGS. 9A and 9B illustrate specific structures of the worm wheel gear, the following gear, and the belt included in the driving unit.
Figure 9B:
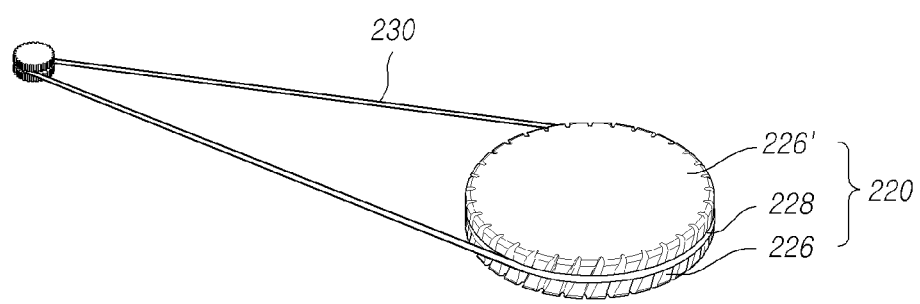

FIGS. 9A and 9B illustrate specific configurations of the driving unit of the display device according to embodiments.

Referring to FIGS. 9A and 9B, the driving unit 200 according to embodiments is an assembly driving the sliding frame 300 to slide with respect to the bottom rail 110 of the back cover 100.

As described above, the driving unit 200 can include the motor 210 fixed to a rear portion of the back cover 100, the worm shaft 212 connected to the motor shaft of the motor 210, the worm wheel gears 220 respectively having first gear teeth provided on the outer circumference thereof to be engaged with the worm shaft 212, the following gears 240 rotating along with the rotation of the worm wheel gears 220 and respectively having second gear teeth to be engaged with the side gears of the sliding frames 300, and the belts 230 connected between the worm wheel gears 220 and the following gears 240 to serve as a power transmission.

FIGS. 9A and 9B illustrate specific structures of the worm wheel gear 220, the following gear 240, and the belt 230 included in the driving unit 200.

In the embodiment of FIG. 9A, an example of the structure of connecting the belt 230 to the worm wheel gear 220 and the following gear 240 using a pulley is illustrated.

For instance, in the embodiment illustrated in FIG. 9A, the worm wheel gear 220 can include a worm wheel gear portion 222 comprised of first gear teeth engaged with the worm shaft 212 and a driving pulley 224 fixedly disposed on the worm wheel gear portion 222, while the following gear 240 can include a following gear portion 242 comprised of second gear teeth engaged with the side gear 320 and a following pulley 244 fixedly disposed on the following gear portion 242.

In this embodiment, the belt 230 is connected to the driving pulley 224 and the following pulley 224 to transmit torque between the worm wheel gear 220 and the following gear 240.

In addition, in the embodiment illustrated in FIG. 9B, the worm wheel gear 220 has a structure comprised of a belt-holding groove 228 provided in the central portion of the outer circumference thereof and worm wheel gear portions 226 and 226' provided on both sides of the belt-holding groove 228.

In addition, the following gear 240 also has a structure comprised of a belt-holding groove provided in the central portion of the outer circumference thereof and following gear portions provided on both sides of the belt-holding groove. According to this structure, the belt 230 is connected to the belt-holding groove 228 of the worm wheel gear 220 and the belt-holding groove of the following gear 240 to transmit torque between the two gears.

The above-described structure of the driving unit 200 is illustrative only. Any other mechanical structure that can drive the sliding frames 300 to slide in response to a control signal to can be included.

Figure 10B:
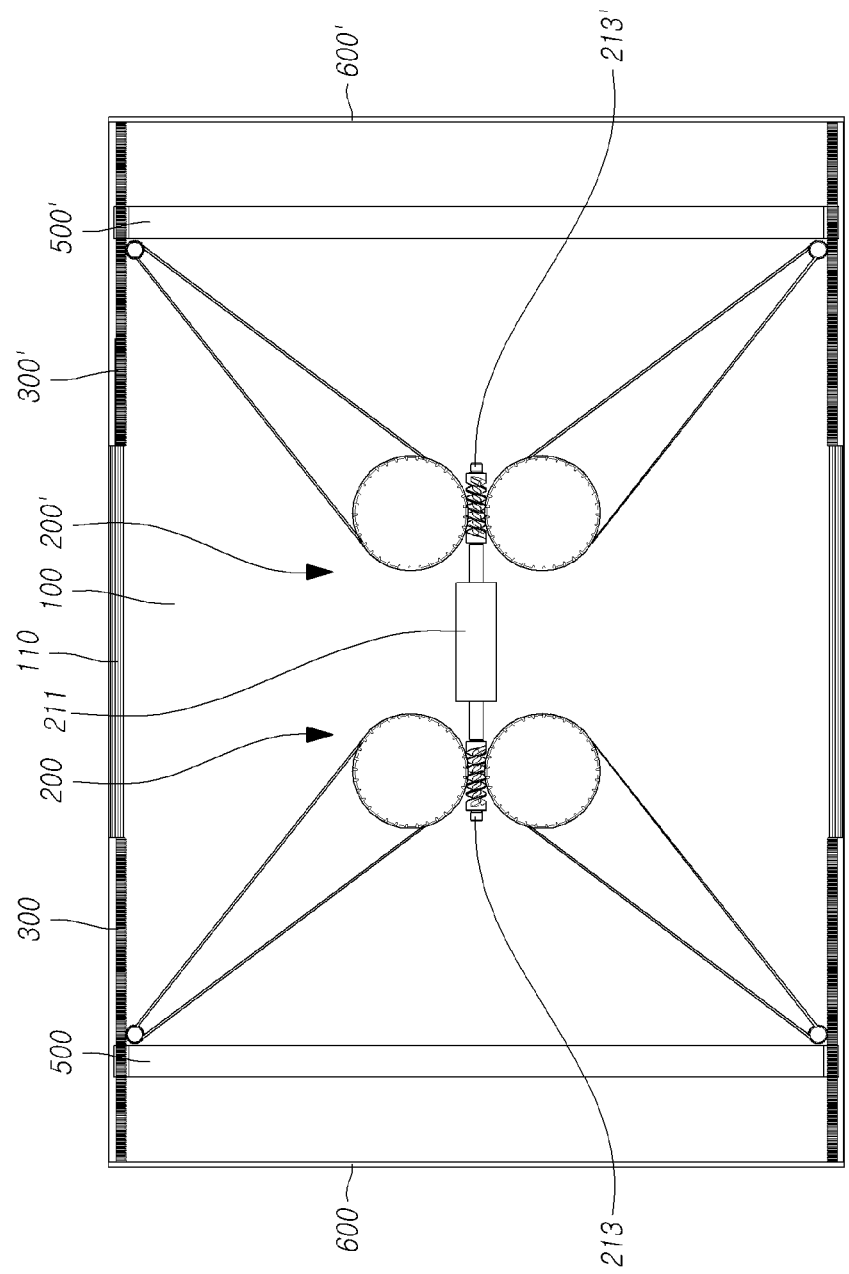

FIGS. 10A and 10B illustrate two applications of the driving unit in the display device according to embodiments.

In the extendable display device according to embodiments, the rollable display panel 600 can have a structure enabling the rollable display panel 600 to be extended with respect to the base display panel, symmetrically in both directions.

In this regard, as illustrated in FIG. 10A, the driving units 200 and 200', the sliding frames 300 and 300', the rolling modules 500 and 500', and rollable display panels 600 and 600' can be symmetrically disposed on left and right portions of the display device.

For instance, as illustrated in FIG. 10A, the first driving unit 200, the first sliding frames 300, the first rolling module 500, and the first rollable display panel 600 can be disposed on the left portion of the display device, while the second driving unit 200', the second sliding frame 300', the second rolling module 500', and the second rollable display panel 600' can be disposed on the right portion of the display device, symmetrically to those disposed on the left portion of the display device.

Here, the first driving motor 210 of the first driving unit 200 and the second driving motor 210' of the second driving unit 200' can be driven by the same control signal so that the display device can be equally extended in both directions. Alternatively, only one of the two driving units can be driven or different driving signals can be applied to the two driving units so that the display device can be asymmetrically extended in both directions.

In the embodiment illustrated in FIG. 10B, a single driving motor 211 can be used to simplify the structure of the driving units.

Specifically, a first worm shaft 213 and a second worm shaft 213' can extend from the single driving motor 211 in both directions, such that the two worm shafts are simultaneously rotated along with the rotation of the single driving motor 211.

In the embodiment illustrated in FIG. 10B, the single driving motor 211 can be a coaxial hollow motor, with motor shafts being disposed on both sides thereof. The first worm shaft 213 and the second worm shaft 213' must be configured such that worm gears thereof are in opposite directions.

The embodiment illustrated in FIG. 10B is advantageous in that the display panel can be simultaneously extended in both directions by only controlling the single driving motor 211, and that the structure can be simplified and power consumption can be reduced due to the reduced number of motors.

In addition, the extendable display device according to embodiments can further include an extension driving unit to control the motor 210 of the driving unit by generating an extension control signal.

The extension driving unit can be provided within a data driver circuit, e.g., data driver integrated circuit (D-IC), or a set printed circuit board (PCB). However, the present disclosure is not limited thereto, and the extension driving unit can be provided as a separate control module.

Figure 11:
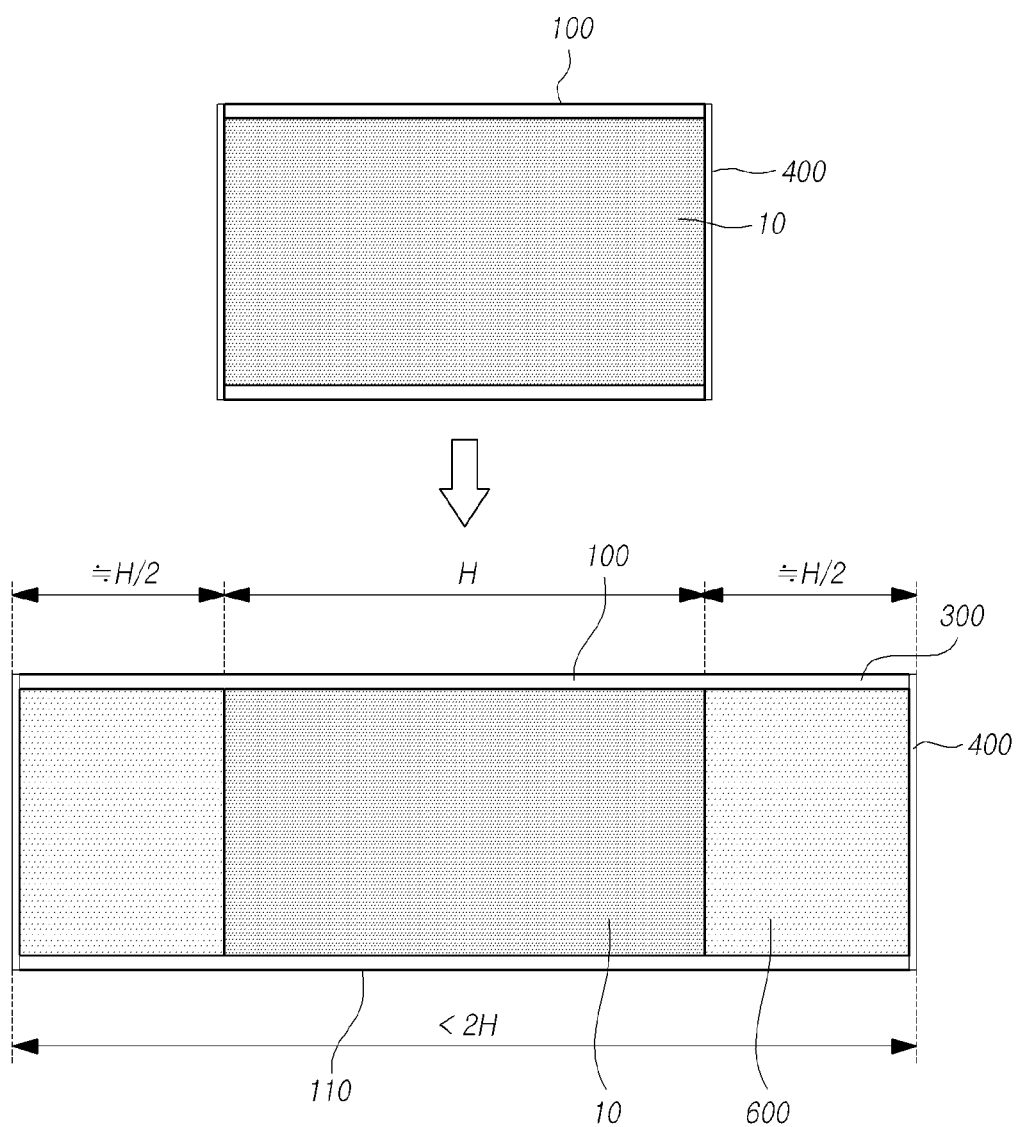
FIG. 11 is a front view illustrating states of the display device according to embodiments of the present disclosure before and after extension.

FIG. 11 is a front view illustrating states of the display device according to embodiments before and after extension.

The upper portion of FIG. 11 illustrates the state in which the display device is not extended, while the lower portion of FIG. 11 illustrates the maximum extended state of the display device.

In the non-extended state, only the base display panel 10 is exposed from the front. In this state, a user can apply a display extension command in order to view widescreen images or the like.

The extension driving unit controls the motor of the driving unit to rotate in response to the display extension command, so that the side frames 400 move to the left and right according to the above-described principle, thereby extending the rollable display panels 600 to the left and right.

As illustrated in the lower portion of FIG. 11, the length of each of the rollable display panels to be extendable to the left or right can be smaller than the half H/2 of the horizontal length H of the base display panel.

Consequently, when the extendable display device according to embodiments is extended to the maximum size, the horizontal length of the entire display panel of the extended display device can be smaller than the double of the horizontal length H of the base display panel.

For example, in a case in which the base display panel has an aspect ratio of 1.33:1 (i.e., about 4:3), the extension structure according to embodiments can extend the aperture ratio to about 2.6:1, so that a widescreen for films having an aspect ratio of 2.35:1 can be sufficiently provided.

In addition, the extendable display device according to embodiments can further include an image controller to output continuous images to the base display panel 10 and the extended rollable display panels 600.

For example, the data driver circuit of the display device according to embodiments can serve as the image controller. The data driver circuit can receive information, indicating the length of extension of the rollable display panels 600, from the extension driving unit, and can determine data lines of the base display panel 10 and the extended rollable display panels 600, on the basis of the received information.

The data driver circuit sets the data lines of the base display panel 10 and the data lines of the extended rollable display panels 600 as a single control unit and applies data signals corresponding to an image to the display panels 10 and 600, so that the extended display device can display the image without a disconnected portion.

Figure 12:
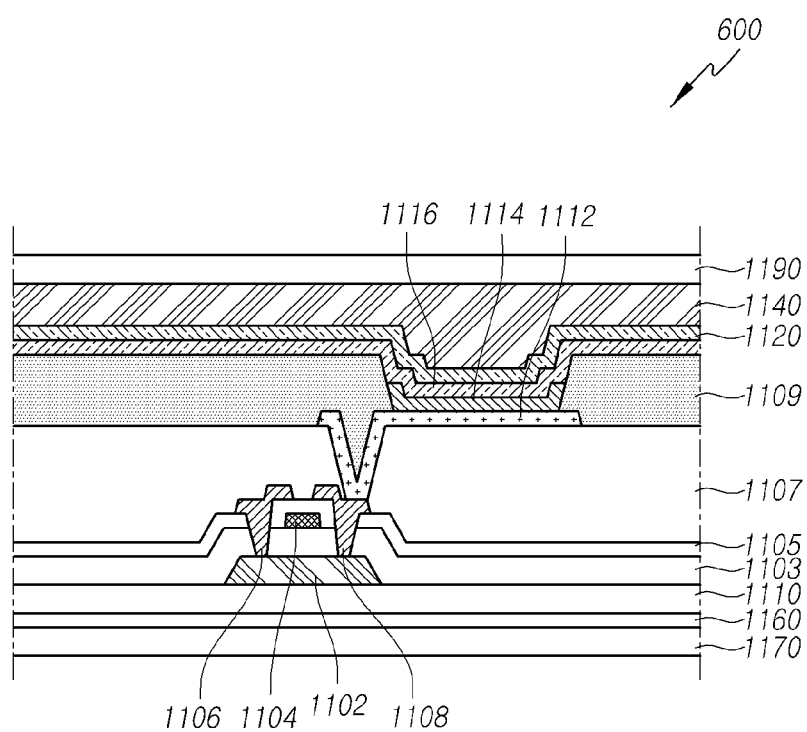
FIG. 12 illustrates an example of a cross-section of the rollable display panel of the display device according to embodiments of the present disclosure.

FIG. 12 illustrates an example of a cross-section of the rollable display panel of the display device according to embodiments.

The rollable display panel 600 according to embodiments can be implemented as a flexible organic light-emitting display panel (or flexible OLED display panel), a flexible electrophoretic display panel, a flexible liquid crystal display (LCD) panel, a flexible electrowetting display panel, or the like.

Such a rollable display panel 600 includes at least one active area (A/A), in which an array of pixels or the like is disposed. At least one inactive area (I/A) can be disposed at the periphery of the active area. That is, the inactive area can be disposed adjacent to one or more peripheral portions of the active area.

Each of the pixels in the active area can be associated with a pixel driver circuit. The pixel driver circuit can include one or more switching transistors and one or more driving transistors. Each of the pixel driver circuits can be electrically connected to a gate line and a data line in order to communicate with a gate driver, a data driver, and the like, disposed in the inactive area.

Each of the gate driver and the data driver can be implemented as a thin-film transistor (TFT) disposed in the inactive area. Such a driver can be referred to as having a gate-in-panel (GIP) structure. Some components, such as a data driver IC, can be mounted on a separate PCB to be connected to a connection interface (e.g., a pad, a bump, or a pin), disposed in the inactive area, via a circuit film, such as a flexible printed circuit board (FPCB), a chip-on-film (COF) package, or a tape-carrier-package (TCP). The printed circuit (e.g., the COF or the PCB) can be located on the rear surface of the display device according to embodiments.

More specifically, FIG. 12 illustrates a cross-sectional structure of the rollable organic light-emitting display panel as an application of the rollable display panel 600 of the display device according to embodiments.

The rollable display panel 600 of the display device according to embodiments can be an organic light-emitting display panel including a substrate, a plurality of TFTs provided on the substrate, a light-emitting layer including an organic light-emitting element layer (or OLED layer) between both electrodes disposed on portions of the TFTs, and an encapsulation layer disposed on the light-emitting layer.

As illustrated in FIG. 12, the rollable organic light-emitting display panel according to embodiments can include elements provided on a flexible substrate. For example, in the organic light-emitting display panel, a TFT 1102, 1104, 1106, and 1108, an array of organic light-emitting elements 1112, 1114, and 1116, and a variety of functional layers, can be disposed on a flexible base substrate 1110.

The base substrate (or array substrate) 1110 can be a substrate made of glass, metal, or plastic, which can be bent or rolled. In the case of a plastic substrate, a polyimide-based material or a polycarbonate-based material can be used.

Regarding the structure of the TFT, a semiconductor layer 1102, a gate insulating film 1103, a gate electrode 1104, an interlayer insulating film 1105, source and drain electrodes 1106 and 1108 can be sequentially disposed on the base substrate 1110.

The semiconductor layer 1102 can be made of polysilicon (p-Si). In this case, a predetermined area of the semiconductor layer can be doped with an impurity. In addition, the semiconductor layer 1102 can be made of amorphous silicon (a-Si), or can be made of at least one of a variety of organic semiconductor materials, such as pentacene. In addition, the semiconductor layer 1102 can be made of an oxide.

The gate insulating film 1103 can be made of an inorganic insulating material, such as silicon oxide (SiOx) or silicon nitride (SiNx), an organic insulating material, or the like. The gate electrode 1104 can be made of at least one selected from among, but not limited to, magnesium (Mg), aluminum (Al), nickel (Ni), chromium (Cr), molybdenum (Mo), tungsten (W), gold (Au), or alloys thereof.

The interlayer insulating film 1105 can be made of an in organic insulating material, such as silicon oxide (SiOx) or silicon nitride (SiNx), an organic insulating material, or the like. Contact-holes, through which the source and drain regions are exposed, can be formed by selectively removing the interlayer insulating film 1105 and the gate insulating film 1103.

The source and drain electrodes 1106 and 1108 are made of a material for the gate electrode 1104, and provided on the interlayer insulating film 1105 as a single-layer or multilayer structure, such that the contact-holes are buried.

A planarization layer 1107 can be located on the TFT 1102, 1104, 1106, and 1108. The planarization layer 1107 can protect and planarize the TFT. The planarization layer 1107 can be provided in a variety of shapes, and can be variously modified. For example, the planarization layer 1107 can be an organic insulating film made of, e.g., benzocyclobutene (BCB) or acryl, or an inorganic insulating film made of, e.g., silicon nitride (SiNx) or silicon oxide (SiOx). The planarization layer 1107 can have a single-layer structure or a multilayer structure.

The organic light-emitting element can have a configuration in which a first electrode 1112, an organic light-emitting layer 1114, and a second electrode 1116 are sequentially disposed. That is, the organic light-emitting element can include the first electrode 1112 disposed on the planarization layer 1107, the organic light-emitting layer 1114 disposed on the first electrode 1112, and the second electrode 1116 disposed on the organic light-emitting layer 1114.

The first electrode 1112 is electrically connected to the drain electrode 1108 of the TFT via a contact-hole. In a case in which the organic light-emitting display device has a top-emission structure, the first electrode 112 can be made of an opaque conductive material having high reflectivity. For example, the first electrode 112 can be made of one selected from among, but not limited to, silver (Ag), aluminum (Al), gold (Au), molybdenum (Mo), tungsten (W), chromium (Cr), or alloys thereof.

A bank 1109 is provided on an area other than the emission area. Thus, the bank 1109 has a bank hole, through which the first electrode 1112 corresponding to the emission area is exposed. The bank 1109 can be made of an inorganic insulating material, such as silicon nitrides (SiNx) or silicon oxide (SiOx), or an organic insulating material, such as benzocyclobutene (BCB), acrylic resin, or imide-based resin.

The organic light-emitting layer 1114 is located on the first electrode 1112 exposed through the bank 1109. The organic light-emitting layer 1114 can include an emissive layer, an electron injection layer, an electron transport layer, a hole transport layer, a hole injection layer, and the like. The organic light-emitting layer 1114 can have a single-layer structure comprised of a single light-emitting layer to emit monochromatic light, or can have a multilayer structure comprised of a plurality of light-emitting layers to emit white light.

The second electrode 1116 is located on the organic light-emitting layer 1114. In a case in which the organic light-emitting display device has a top-emission structure, the second electrode 1116 can be made of a transparent conductive material, such as indium tin oxide (ITO) or indium zinc oxide (IZO), thereby allowing light, generated by the organic light-emitting layer 1114, to exit upwardly therethrough.

A passivation layer 1120 is located above the second electrode 1116. The passivation layer 1120 can be provided as an inorganic layer made of glass, metal, aluminum oxide (AlOx), or a silicon (Si)-based material, or can have a structure in which organic and inorganic films are alternately stacked on each other. The passivation layer 1120 can prevent the penetration of oxygen or moisture from the ambient atmosphere in order to prevent the light-emitting material and the electrode material from being oxidized. When the organic light-emitting material is exposed to moisture or oxygen, pixel shrinkage can occur so that the emission area is reduced or a dark spot can occur in the emission area.

A bonding layer 1140 can be located on the passivation layer 1120. The bonding layer 1140 can serve to bond the base substrate 1110 and an encapsulation plate 1190 while providing a seal.

The encapsulation plate 1190 is an encapsulation layer disposed above the organic light-emitting layer, opposite to the array substrate (or base substrate) 1110. Specifically, the bottom surface of the encapsulation plate 1190 is bonded to the bonding layer 1140. The encapsulation plate 1190 can be made of a material, such as glass, polymer, or metal. The material of the encapsulation plate 1190 can be determined depending on the direction of emission of the organic light-emitting display device.

The bonding layer 1140 is located between the TFT/OLED, comprised of the pixel driver circuit and the organic light-emitting element, and the encapsulation plate 1190. Typically, after the bonding layer 1140 is attached to the encapsulation plate 1190, the encapsulation plate 1190 and the base substrate 110 are bonded together by placing the bonding layer 1140 to face the TFT/OLED. The bonding layer 1140 can be made of a mixture of a curable resin and a functional additive. For example, the bonding layer 1140 can be comprised of a curable resin and at least one of a getter, a filler, or a combination thereof, dispersed in the curable resin. The curable resin can be made of, but is not limited to, an epoxy-based polymer or an olefin-based polymer.

A bottom bonding layer 1160 and a bottom encapsulation layer 1170 are sequentially provided below the base substrate 1110. The bottom encapsulation layer 1170 can be made of at least one organic material selected from among, but not limited to, polyethylene naphthalate (PEN), ployethylene terephthalate (PET), polyethylene ether phthalate, polycarbonate, polyarylate, polyether imide, polyether sulfonate, polyimide, and polyacrylate. The bottom encapsulation layer 1170 can serve to prevent the penetration of oxygen or moisture from the ambient atmosphere.

The bottom bonding layer 1160 can be made of a thermosetting adhesive or a natural setting adhesive, and can serve to bond the bottom substrate 1110 and the bottom encapsulation layer 1170. For example, the bottom bonding layer 1160 can be made of a material, such as optical clear adhesive (OCA).

The illustration of FIG. 12 is only an example of the rollable display panel 600 according to embodiments. Any other type of flexible display panel that can operate according to the present disclosure can be used. In this case, the flexible display panel can be accommodated within the rolling module 500, wound with a certain amount of force, and can be exposed externally when unwound.

In addition, the extendable display device according to embodiments can further include a set cover or the like provided on the rear surface of the back cover 100, on which the driving unit 200 and the rolling module 500 for extending the rollable display panel are mounted.

The term "display device" used herein not only has a narrow sense of a display device, corresponding to an OLED display module including a display panel and a driver circuit to drive the display panel, but also has a broad concept of a display device, corresponding to set electronic devices or set devices, i.e., finished products including the OLED module, e.g., a notebook computer, a TV, a computer monitor, and a mobile electronic device, such as a smartphone or an electronic notebook.

That is, the term "display device" used herein not only has a narrow sense of a display device, corresponding to an OLED module, but also has a broad concept of display device, including a set device, i.e., an application product including the OLED module.

As set forth above, according to embodiments, the extendable display device has a structure able to extend the rollable display panel with respect to the base panel, thereby expanding a viewing area in a predetermined direction.

More specifically, the extendable display device includes the base display panel and the extension structure comprised of the motor, the gears, and the sliding frames. The extension structure can extend the rollable display panel from the base display panel, so that a user can extend the display device depending on types of images displayed.

In this regard, the display device includes the base display panel, the sliding frames slidable with respect to the back cover, and the rollable display panel extendable outside of the rolling module in response to the sliding of the sliding frames, so that the user can extend the rollable display panel as needed when widescreen images are displayed.

The above description and the accompanying drawings provide an example of the technical idea of the present disclosure for illustrative purposes only. Those having ordinary knowledge in the technical field, to which the present disclosure pertains, will appreciate that various modifications and changes in form, such as combination, separation, substitution, and change of a configuration, are possible without departing from the essential features of the present disclosure. Therefore, the embodiments disclosed in the present disclosure are intended to illustrate the scope of the technical idea of the present disclosure, and the scope of the present disclosure is not limited by the embodiment. The scope of the present disclosure shall be construed on the basis of the accompanying claims in such a manner that all of the technical ideas included within the scope equivalent to the claims belong to the present disclosure.

What is claimed is:
1. A display device comprising:
a base display panel;
a back cover supporting a rear portion of the base display panel, the back cover including bottom rails;
sliding frames sliding with respect to the back cover;
a driving unit configured to drive the sliding frames to slide with respect to the bottom rails of the back cover; and
a rollable display panel being extendable in response to the sliding of the sliding frames.

2. The display device according to claim 1, wherein the bottom rails are provided on a top portion and a bottom portion of the back cover, respectively, to extend in a direction, the sliding frames respectively include a top rail, a side gear, and a rear gear, the top rail being engaged with a corresponding bottom rail of the bottom rails, and the driving unit is gear-engaged with the side gears of the sliding frames to slide the sliding frames with respect to the bottom rail of the back cover.

3. The display device according to claim 2, further comprising a rolling module fixed to the back cover and winding the rollable display panel therein, wherein the rollable display panel is extended from the rolling module or retracted into the rolling module in response to the sliding of the sliding frames.

4. The display device according to claim 3, wherein the rolling module includes:

a body;

a panel holder supporting a side portion of the rollable display panel;

a shaft rotating together with the panel holder; and a rolling gear fixedly coupled to the shaft and the panel holder, and engaged with the rear gear of a corresponding sliding frame of the sliding frames to rotate in response to the sliding of the sliding frames.

5. The display device according to claim 4, wherein the rolling module further includes side caps coupled to both ends of the body, respectively, a portion of the rolling gear being exposed from a corresponding side cap of the side caps to be engaged with the rear gear of a corresponding sliding frame of the sliding frames.

6. The display device according to claim 3, wherein the driving unit, the sliding frames, the rolling module, and the rollable display panel are symmetrically disposed on both portions of the display device.

7. The display device according to claim 2, wherein the driving unit includes:

a motor fixed to the back cover;

a worm shaft connected to a motor shaft of the motor;

a worm wheel gear having first gear teeth engaged with the worm shaft;

a following gear rotating in response to a rotation of the worm wheel gear, the following gear having second gear teeth engaged with the side gear of a corresponding sliding frame of the sliding frames; and a belt transferring power between the worm wheel gear and the following gear.

8. The display device according to claim 2, wherein the driving unit includes:

a motor fixed to the back cover;

a worm shaft connected to a motor shaft of the motor;

a worm wheel gear having first gear teeth engaged with the worm shaft;

a driving pulley disposed on the worm wheel gear;

a following gear rotating in response to a rotation of the worm wheel gear, the following gear having second gear teeth engaged with the side gear of a corresponding sliding frame of the sliding frames;

a following pulley disposed on the following gear; and a belt connected between the driving pulley and the following pulley.

9. The display device according to claim 1, further comprising a side frame coupled to a side portion of the rollable display panel to move along with the sliding of the sliding frames.

10. The display device according to claim 1, wherein the rollable display panel comprises an organic light-emitting display panel including:

a plurality of thin-film transistors disposed on a substrate;

a light-emitting layer including an organic light-emitting element layer between both electrode layers disposed on the thin-film transistors; and an encapsulation layer disposed on the light-emitting layer.

* * * * *